(12) United States Patent
Duric et al.

(10) Patent No.: US 7,818,890 B2
(45) Date of Patent: Oct. 26, 2010

(54) MAGNETIC FIELD SENSOR CIRCUIT

(75) Inventors: Haris Duric, Helmond (NL); Teunis Jan Ikkink, Geldrop (NL); Hans Marc Bert Boeve, Hechtel-Eksel (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/516,173

(22) PCT Filed: Nov. 20, 2007

(86) PCT No.: PCT/IB2007/054705

§ 371 (c)(1),
(2), (4) Date: May 22, 2009

(87) PCT Pub. No.: WO2008/065574

PCT Pub. Date: Jun. 5, 2008

(65) Prior Publication Data

US 2010/0053789 A1 Mar. 4, 2010

(30) Foreign Application Priority Data

Nov. 27, 2006 (EP) .................................. 06124809

(51) Int. Cl.
*G01B 17/30* (2006.01)
(52) U.S. Cl. ..................................... 33/355 R; 324/209
(58) Field of Classification Search ............... 33/355 R; 324/209, 252; 340/572.1, 505
See application file for complete search history.

(56) References Cited

U.S. PATENT DOCUMENTS 4,063,181 A * 12/1977 Lefebvre et al. ............... 327/72

(Continued)

FOREIGN PATENT DOCUMENTS

| DE | 43 43 686 A1 | 8/1994 |
| DE | 199 47 761 A1 | 4/2001 |
| EP | 1 637 898 A | 3/2006 |
| JP | 09 126780 A | 5/1997 |
| JP | 2002 181908 A | 6/2002 |
| KR | 2004 0062912 | 7/2004 |

OTHER PUBLICATIONS

Philips Semiconductors; "General Magnetic Field Sensors, Discrete Semidoncutors—Data Sheet, SC17"; Jun. 12, 1998; pp. 1-58.

*Primary Examiner*—Yaritza Guadalupe-McCall

(57) ABSTRACT

A magnetic field sensor circuit comprises a first magneto-resistive sensor (Rx) which senses a first magnetic field component in a first direction to supply a first sense signal (Vx). A first flipping coil (FC1) applies a first flipping magnetic field with a periodically changing polarity to the first magneto-resistive sensor (Rx) to cause the first sense signal (Vx) to have alternating different levels synchronized with the first flipping magnetic field. A second magneto-resistive sensor (Ry) senses a second magnetic field component in a second direction different than the first direction to supply a second sense signal (Vy). A second flipping coil (FC2) applies a second flipping magnetic field with a periodically changing polarity to the second magneto-resistive sensor (Ry) to cause the second sense signal (Vy) to have an alternating different levels synchronized with the second flipping magnetic field. The first flipping magnetic field and the second flipping magnetic field have a phase shift. A differential amplifier (AMP1) receives the first sense signal (Vx) and the second sense signal (Vy) to obtain a difference signal (Vd). A first synchronous demodulator (DEM1) receives the difference signal (Vd) and a first switching signal (Q1) being phase locked to the alternating different levels of the first sense signal (Vx) to supply a first output signal (Vox) indicating the first magnetic field component. A second synchronous demodulator (DEM2) receives the difference signal (Vd) and a second switching signal (Q2) being phase locked to the alternating different levels of the second sense signal (Vy) to supply a second output signal (Voy) indicating the second magnetic field component.

11 Claims, 6 Drawing Sheets

U.S. PATENT DOCUMENTS

| | | | |
|---|---|---|---|
| 4,918,824 A | 4/1990 | Farrar | |
| 6,486,663 B1 * | 11/2002 | Steinlechner | 324/252 |
| 6,529,127 B2 * | 3/2003 | Townsend et al. | 340/505 |
| 6,778,070 B1 * | 8/2004 | Thomas | 340/10.1 |
| 7,256,695 B2 * | 8/2007 | Hamel et al. | 340/572.1 |
| 7,362,096 B2 * | 4/2008 | Oberdier et al. | 324/209 |
| 2007/0285248 A1 * | 12/2007 | Hamel et al. | 340/572.1 |
| 2008/0294581 A1 | 11/2008 | Ikkink et al. | |
| 2009/0213914 A1 * | 8/2009 | Dong et al. | 375/219 |
| 2010/0114517 A1 * | 5/2010 | Boeve et al. | 702/92 |
| 2010/0115779 A1 * | 5/2010 | Boeve et al. | 33/355 R |

* cited by examiner

MAGNETIC FIELD SENSOR CIRCUIT

FIELD OF THE INVENTION

The invention relates to a magnetic field sensor circuit, an electronic compass comprising the magnetic field sensor circuit, a hand-held apparatus comprising the magnetic field sensor circuit, and a vehicle comprising the magnetic field sensor circuit.

BACKGROUND OF THE INVENTION

The Philips Semiconductors data sheet for discrete semiconductors with title "General Magnetic field sensors" of Jun. 12, 1998, further indicated by "File under Discrete Semiconductors, SC17" discloses a magnetic field sensor which comprises four magneto-resistive sensors arranged in a Wheatstone bridge.

The magneto-resistive sensors are composed of a strip of ferromagnetic material called permalloy. The resistance of the magneto-resistive sensor depends on the angle between the current through the strip of ferromagnetic material and the internal magnetization vector. The internal magnetization vector depends on a strength of a component of an external magnetic field applied perpendicular to the current direction in the sensor.

Such a magneto-resistive sensor is by nature bi-stable. A flipping coil is added which generates brief, strong, non-permanent magnetic field pulses of very short duration (a few microseconds) with alternating opposite direction. These alternating magnetic fields, which can easily be generated by simply winding a coil around the sensor, are used to eliminate offset effects. Depending on the current direction of the current pulses through the flipping coil, positive or negative flipping fields are generated in the direction parallel to the current direction. The flipping causes a change in the polarity of the sensor output signal. Essentially, the unknown field in the normal magnetization direction plus the offset is sensed in one half of the sense cycle, while the unknown field in the inverted magnetization direction plus the offset is sensed during the other half of the cycle. This results in two different outputs symmetrically positioned around the offset value. After high pass filtering, rectification and low-pass filtering a single, continuous value free of offset is obtained for the unknown field.

The magneto-resistive sensor comprises four magneto-resistive elements which are arranged in a Wheatstone bridge configuration. A differential amplifier senses the voltage between two connection points of the bridge to provide an output signal representative of the magnetic field measured. It has to be noted that two such bridges are required, each with their own differential amplifier to sense the magnetic field in two different directions.

The data sheet further discloses that an optimal method of compensating for temperature dependent sensitivity differences uses electromagnetic feedback. This method takes into account that the output of the magneto-resistive sensor is independent of the temperature if no external magnetic field is applied. A compensation coil is added to generate a magnetic field which compensates the external field. Thus, the compensation coil generates a magnetic field perpendicular to the magnetic field generated by the flipping coil. If the external magnetic field varies, the sensors output voltage changes too. This voltage change is converted into a current through the compensation coil. The compensation coil produces a magnetic field proportional to the output voltage change. This field has a direction opposite to the direction of the component of the external field which is sensed. Thus, the field of the compensation coil compensates exactly for the external field. The current through the compensation coil is a measure for the sensed external magnetic field.

The data sheet shows in FIG. 26 an integrator IC2B which filters the voltage across the magneto-resistive sensor and which feeds the filtered voltage back to the operational amplifier which amplifies the voltage across the magneto-resistive sensor to obtain an offset compensation.

The prior art magnetic field sensor circuit has the drawback that it does not perform optimally when a disturbing EM (Electro-Magnetic) radiation is present.

SUMMARY OF THE INVENTION

It is an object of the invention to provide a magnetic field sensor circuit which has an improved performance in the presence of disturbing EM radiation.

A first aspect of the invention provides a magnetic field sensor circuit as claimed in claim 1. A second aspect of the invention provides an electronic compass as claimed in claim 8. A third aspect of the invention provides a hand-held apparatus as claimed in claim 9. A fourth aspect of the invention provides a vehicle as claimed in claim 11. Advantageous embodiments are defined in the dependent claims.

A magnetic field sensor circuit in accordance with the first aspect of the invention comprises a first magneto-resistive sensor which senses a first magnetic field component in a first direction to supply a first sense signal. This first direction is the direction substantially perpendicular to the current direction in the magneto-resistive element. A first flipping coil is associated with the first magneto-resistive sensor to apply a first flipping magnetic field with a periodically changing polarity to the first magneto-resistive sensor. Usually, the flipping coil is driven with relatively short pulses which alternate in polarity. The actual sensing of the external magnetic field is performed in-between the pulses.

The magnetic field sensor circuit further comprises a second magneto-resistive sensor which senses a second magnetic field component in a second direction different than the first direction to supply a second sense signal. A second flipping coil is associated with the second magneto-resistive sensor for applying a magnetic field with a periodically changing polarity to the second magneto-resistive sensor.

A differential amplifier receives the first sense signal and the second sense signal to supply a difference signal which is the difference of the first and the second sense signal. A first synchronous demodulator receives the difference signal and a first switching signal which is phase locked to the alternating different levels of the first sense signal to supply a first output signal indicating the first magnetic field component. A second synchronous demodulator receives the difference signal and a second switching signal being phase locked to the alternating different levels of the second sense signal to supply a second output signal indicating the second magnetic field component. The different levels in the first and second sense signal occur at a same external magnetic field because of the alternating polarity of the fields generated by the first and the second flipping coils, respectively.

In contrast to the prior art, the differential amplifier now supplies a difference signal which is the subtraction of the sense signals obtained by the two magneto-resistive sensors. Consequently, the influence of common mode EM radiation which is present on both the first and the second sense signal is largely suppressed in the output signal of the differential amplifier.

The already present flip coils are used to obtain sense signals with alternating different levels and different phases. The synchronous demodulators use switching signals locked to the different phases of the sense signals to separate the first and second sense signals present in the same difference signal. The synchronous demodulators operate in a well-known manner and are not elucidated in detail.

In an embodiment, the first magneto-resistive sensor is a first magneto-resistive element and the second magneto-resistive sensor is a second magneto-resistive element. A first current source supplies a first current to the first magneto-resistive element to obtain the first sense signal across the first magneto-resistive element. A second current source supplies a second current to the second magneto-resistive element to obtain the second sense signal across the second magneto-resistive element. Thus, instead of two Wheatstone bridges of each four magneto-resistive elements, now only two magneto-resistive elements are required. This has the advantage that considerably less space is required for the sensor, which is particularly relevant in mobile applications. It has to be noted that in the full Wheatstone bridge configuration with a particular sensor area, the sensed voltage is about twice as high as across a single magneto-resistive element with one quarter of the particular area.

In an embodiment, the magnetic field sensor circuit further comprises a first driver which supplies a current having a first sequence of pulses with alternating polarity to the first flipping coil and a second driver which supplies a current having a second sequence of pulses with alternating polarity to the second flipping coil. At a constant external magnetic field, the alternating polarity of the first driver pulses cause the first sense signal to have two alternating different levels. One level occurs synchronized with the first driver pulses having a positive level, the other level occurs synchronized with the first drive pulses having the negative level. Thus, the level of the first sense signal changes after each pulse supplied by the driver. In the same manner, at a constant external magnetic field, the alternating polarity of the second driver pulses cause the second sense signal to have two different levels. The pulses of the first sequence and the second sequence have a non-zero phase shift to be able to retrieve the first and the second sense signal which are combined in the difference signal with synchronous demodulation.

In an embodiment, the level of the first switching signal which is used to retrieve the first sense signal from the difference signal changes for each one of the pulses of the first sequence such that synchronous demodulation is effected. The level of the second switching signal changes for each one of the pulses of the second sequence to effect synchronous demodulation of the second sense signal.

In an embodiment, both the magnetic field sensors are flipped while the synchronous demodulators DEM1 and DEM2 are kept on hold, meaning that the difference signal is multiplied by a value one. After each one the low-pass filters the DC value of the offset is obtained. The alternating part resulting form the difference of the earth magnetic signal measured by two magnetic field sensors is filtered out.

In an embodiment, the magnetic field sensor circuit further comprises an analog to digital converter for converting the difference signal into a digital difference signal. The DC-level controller comprises a digital to analog converter to control the second current source in response to at least one of the output signals when the synchronous demodulators are kept on hold.

In an embodiment, the magnetic field sensor circuit further comprises a first low-pass filter or a first integrator for low-pass filtering the first output signal, and a second low-pass filter or second integrator for low-pass filtering the second output signal. The first low pass filter and the second low-pass filter may have a bandwidth in a range from 500 to 1000 Hz such that it is possible to detect a free fall of the magnetic field sensor.

The magnetic field sensor can be implemented in an electronic compass. An accelerometer is optionally used to determine the tilt of the device with respect to the horizontal plane. In this manner a tilt-compensated e-compass can be achieved. Alternatively, an e-compass can be built using only a 2D or 3D magnetometer, but then the device needs to be held horizontal (as a mechanical compass) or only a restricted tilt range can be allowed by applying certain software compensation. Due to the small dimensions of the magnetic field sensor it can be advantageously implemented in hand-held apparatuses such as for example PDA's and mobile phones. The high common mode rejection is especially interesting in apparatuses in which high EM fields occur, such as for example mobile phones, or vehicles.

The output signals of the magnetic field sensor circuit in conjunction with an accelerometer can be used to detect whether the hand-held apparatus is falling. If is detected that the hand-held apparatus is actually falling, appropriate actions may be taken to minimize the damage when the apparatus hits a surface. For example, if the hand-held apparatus comprises a hard disk, the head of the hard disk may be moved in a parking zone.

These and other aspects of the invention are apparent from and will be elucidated with reference to the embodiments described hereinafter.

It should be noted that items which have the same reference numbers in different Figures, have the same structural features and the same functions, or are the same signals. Where the function and/or structure of such an item has been explained, there is no necessity for repeated explanation thereof in the detailed description.

DETAILED DESCRIPTION

Figure 1:
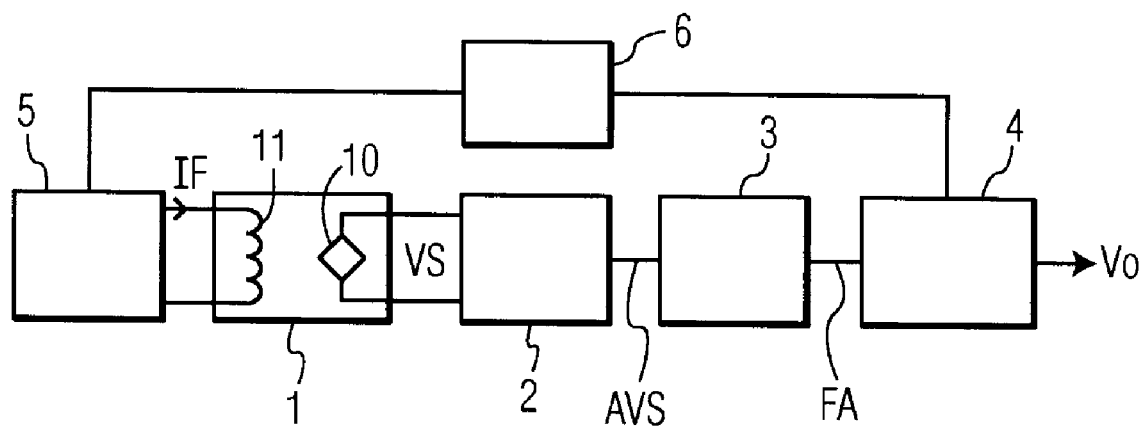
FIG. 1 shows a circuit diagram of a prior art magnetic field sensor circuit using a flipping coil.

FIG. 1 shows a circuit diagram of a prior art magnetic field sensor circuit using a flipping coil. The magnetic field sensor circuit comprises a sense unit 1 comprising a magnetic field sensor 10 and a flipping coil 11, a pre-amplifier 2, an offset filter 3, a phase sensitive demodulator 4, a flipping driver 5, and a clock circuit 6.

The flipping driver supplies a current IF through the flipping coil 11. The polarity of the current IF is periodically alternated to change the sensor operation between two stable operation modes in which the strip of sensor material is magnetized in opposite directions. Once the sensor 10 is put in one of the stable operation modes it will stay in this mode until the field applied is sufficiently strong the change the magnetization of the strip in the opposite direction. Thus, during a short time a current pulse IF is supplied to the flipping coil such that the strip is magnetized in one of the two directions. Next, this pulse is removed and the sensor 10, which is the first operation mode wherein its resistance increases with increasing strength of the applied external field, is ready to sense the external magnetic field. Than, again during a short time a current pulse IF is supplied to the flipping coil such that the strip is magnetized in the opposite direction. After this pulse has ended, the sensor 10, which is now in the second operation mode wherein its resistance decreases with increasing external field, is ready for a second sensing of the external field. Thus, the flipping causes a change of the level of the sensor output signal VS. The output signal VS of the sensor during the first and the second mode of operation are symmetrically positioned around the offset value. The pre-amplifier 2 amplifies the two output signals VS. The offset filter 3 high-pass filters the amplified output signals AVS. The phase sensitive demodulator 4 rectifies the filtered output signals FA to obtain a level of the output voltage VO which is a measure for the strength of the component of the sensed magnetic field in a direction perpendicular to the current direction through the sensor 10.

The sensor 10 comprises four magneto-resistive sensor elements which are arranged in a Wheatstone bridge. This does not mean that the sensor elements must be mechanically positioned according to the usual representation of the elements in a Wheatstone bridge. The bodies of all four sensor elements may be arranged in parallel and are interconnected to electrically form a Wheatstone bridge. The current need not flow in the sensor elements in the same direction as in which the bodies extent. For example, barber poles (conductive strips on the body which have an angle with the direction in which the body extends) may be used to obtain a linearization of the magneto-resistive effect (see for example FIG. 12 of the Philips Data Sheet referred to earlier).

Figure 2:
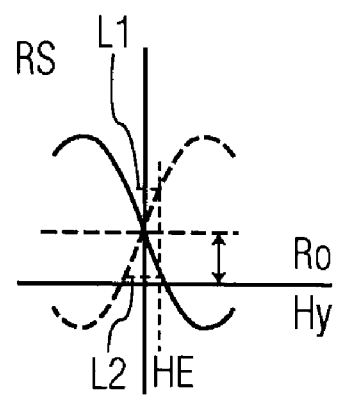
FIG. 2 shows the known two stable operating modes of a magneto-resistive sensor element.

FIG. 2 shows the known two stable operating modes of a magneto-resistive sensor element. The applied magnetic field component Hy in the direction perpendicular to the current direction in the material of the magnetic sensor 10 is depicted along the horizontal axis. The resistance RS of the sensor 10 is depicted along the vertical axis. In the first mode of operation, as result of the flipping pulse with a particular polarity, the internal magnetization of the sensor 10 is directed such that the resistance versus applied magnetic field component behaves according to the non-dashed curve. In the second mode of operation, as result of the flipping pulse in the opposite polarity, the internal magnetization of the sensor has the opposite direction and the resistance versus applied magnetic field component behaves according to the dashed curve. Both curves have the offset RO.

If the external magnetic field component has a value HE, the sequential measurement of this field component during the two operation modes provide different resistance values L2 and L1 which are symmetrical with respect to the offset RO.

FIG. 3 shows signals for elucidating the operation of the circuit shown in FIG. 1.

Figure 3A:
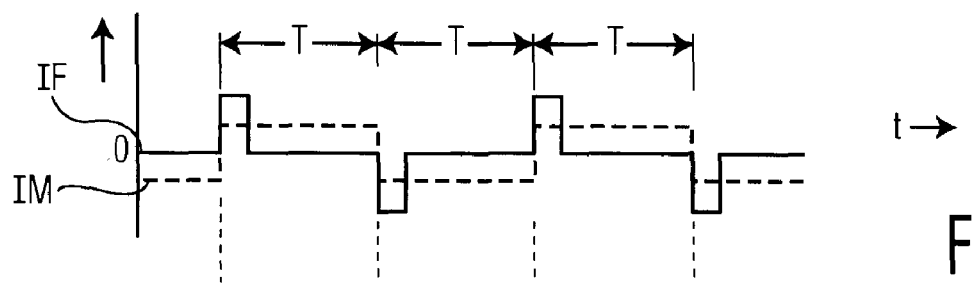
FIGS. 3A to 3D show signals for elucidating the operation of the circuit shown in FIG. 1.

FIG. 3A shows the flipping current pulses IF through the flipping coil 11 and the resulting internal magnetization IM (see the dashed line) of the material of the sensor 10.

Figure 3B:
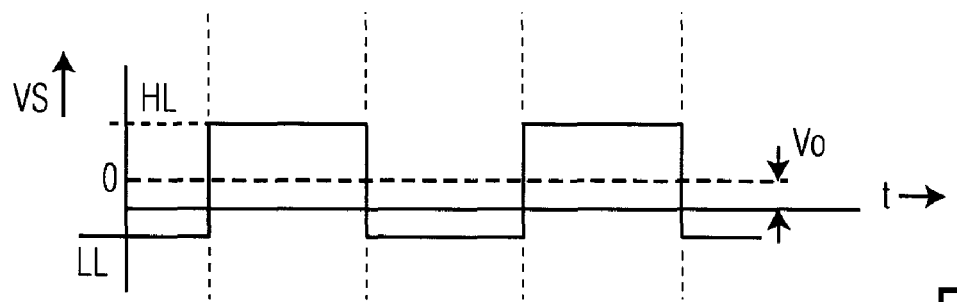

FIG. 3B shows the sense voltage VS across the sensor 10. The level HL is determined by the resistance of the sensor 10 during the first mode of operation and the level LL is determined by the resistance of the sensor 10 during the second mode of operation. In the embodiment elucidated with respect to FIG. 3, the sensed magnetic field is larger than the field HE shown in FIG. 2. Now, the polarity of the sensed voltages VS differs. The offset voltage VO corresponds to the offset resistance RO in FIG. 2.

Figure 3C:
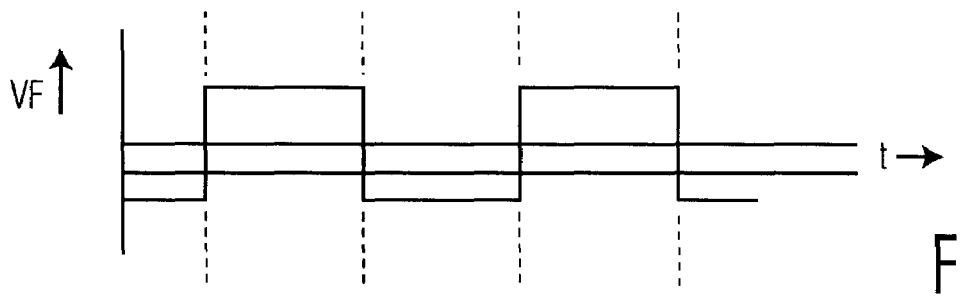

FIG. 3C shows the high-pass filtered signal FA from which is symmetrical with respect to zero such that the offset is removed.

Figure 3D:
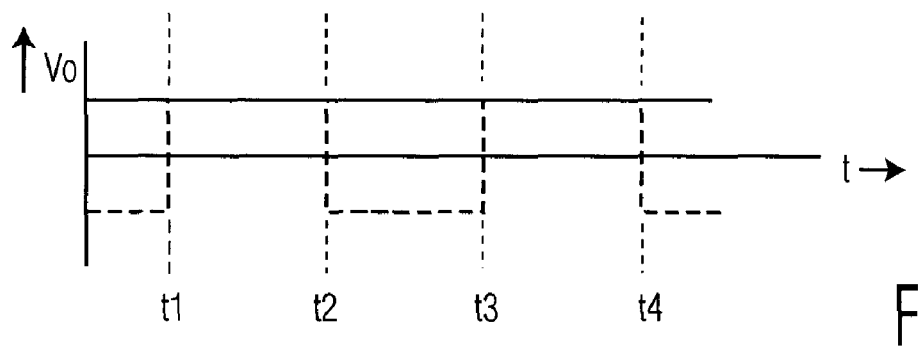

FIG. 3D shows the output signal VO which is the rectified high-pass filtered signal FA. In the embodiment shown in FIG. 3, the periods in time t1 to t2 and t3 to t4 during which the magnetization IM is positive, and the periods in time t2 to t3 during which the magnetization IM is negative have an identical duration T.

Figure 4:
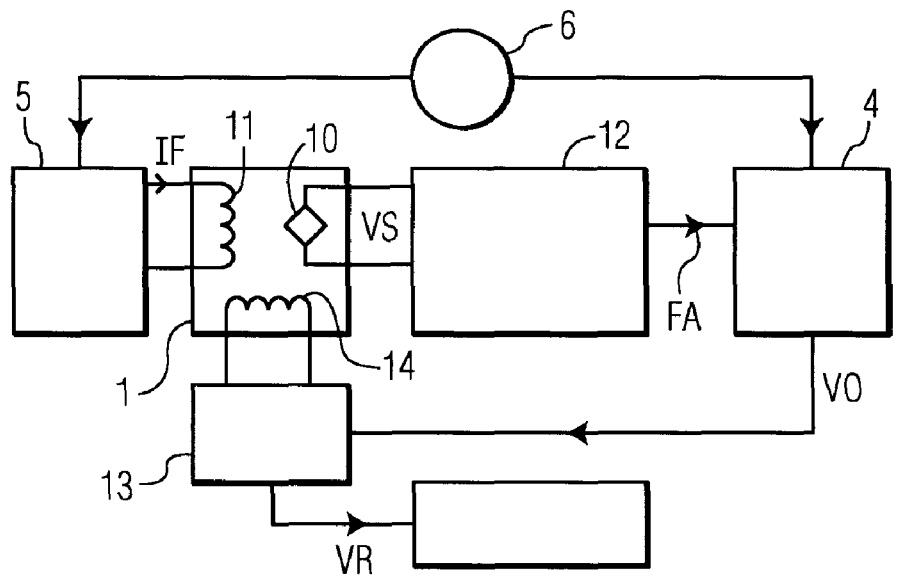
FIG. 4 shows a circuit diagram of a prior art magnetic field sensor using a flipping coil and a compensation coil.

FIG. 4 shows a circuit diagram of a prior art magnetic field sensor using a flipping coil and a compensation coil. The magnetic field sensor circuit comprises a sense unit 1 comprising the magnetic field sensor 10, the flipping coil 11 and the compensation coil 14, a combined pre-amplifier and offset suppression circuit 12, a phase sensitive demodulator 4, a flipping driver 5, a clock circuit 6, and a current regulator 13.

The part of the circuit comprising the flipping driver, the flipping coil 11, the pre-amplifier and offset suppression circuit and the phase sensitive demodulator 4 is identical to the circuit shown in FIG. 1 and thus operates in the same manner. The combined pre-amplifier and offset suppression circuit 12 is the combination of the preamplifier 2 and the offset filter 3 shown in FIG. 1.

Now, the output signal VO of the phase sensitive demodulator 4 is used to control the current regulator 13 to supply a current through the compensation coil 14 such that the magnetic field produced by the compensation coil 14 compensates for the to be sensed external magnetic field. The current regulator 13 supplies an output signal VR which represents the current required through the compensation coil 14 and is a measure for the strength of the external magnetic field component perpendicular to the current direction in the sensor elements of the sensor 10. This electromagnetic feedback provides an accurate compensation of the sensitivity drift with temperature because this drift is minimal for a zero total field at the sensor 10.

It has to be noted that both with respect to the circuits shown in FIGS. 1 and 4, if a two-dimensional magnetic field has to be sensed, two such circuits are required. Thus, two Wheatstone bridges of sensors 10 are required which are positioned such that they are responsive to magnetic field components which have different directions. An optimal sensitivity is reached if the Wheatstone bridges of sensors 10 are positioned such that they are responsive to perpendicular magnetic field component vectors.

Figure 5:
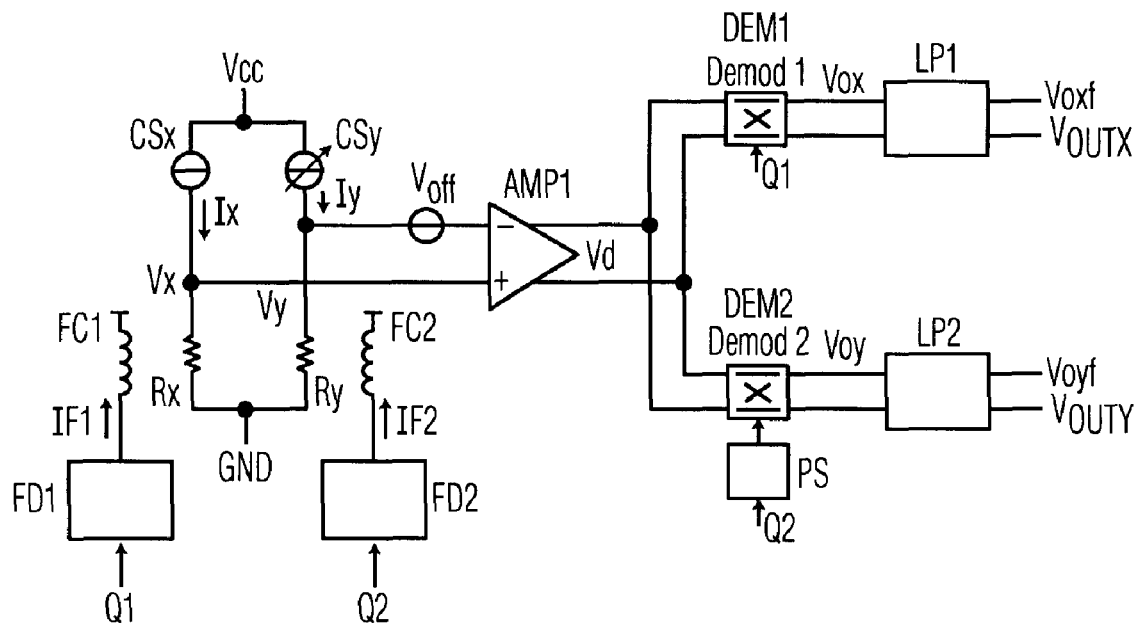
FIG. 5 shows a circuit diagram of an embodiment of the magnetic field sensor circuit in accordance with the invention.

FIG. 5 shows a circuit diagram of an embodiment of the magnetic field sensor circuit in accordance with the invention.

A first magneto-resistive sensor Rx is positioned to obtain a maximum sensitivity in a first direction. Thus, if the sensor Rx is a single magneto-resistive element, the first direction is perpendicular to the current direction through the material of the sensor. If the sensor Rx comprises four magneto-resistive elements arranged in a Wheatstone bridge, this bridge is arranged such that the maximum sensitivity is obtained in the first direction. A second magneto-resistive sensor Ry is positioned to obtain a maximum sensitivity in a second direction different than the first direction. Again, the sensor Ry may be a single magneto-resistive element or a Wheatstone bridge of magneto-resistive elements. In an embodiment, the first and second directions are perpendicular to obtain a maximum sensitivity of the sensor circuit for a two-dimensional external field to be sensed.

A current source CSx supplies a current Ix to the sensor Rx to obtain a sensor voltage Vx, and a current source CSy supplies a current Iy to the sensor Ry to obtain a sensor voltage Vy. One or both of the current sources CSx, CSy may be controllable to compensate for the offset in the system. The offset is indicated by the lumped offset voltage source Voff. In the embodiment shown, the current source CSy is adjustable.

A driver FD 1 receives a timing signal Q1 to control a current IF1 through the flipping coil FC1 associated with the sensor Rx. A driver FD2 receives a timing signal Q2 to control a current IF2 through the flipping coil FC2 associated with the sensor Ry.

A differential amplifier AMP1 has a non-inverting input to receive the sensor voltage Vx and an inverting input to receive the sensor voltage Vy. The polarity of the inputs of the differential amplifier AMP1 may be interchanged without changing the essential operation of the circuit. The voltage source indicated by Voff is not actually present but indicates the offset voltage in the system. The amplifier AMP1 supplies the difference signal Vd which in the embodiment shown is a differential signal.

The synchronous demodulator DEM1 receives the difference signal Vd and the timing signal Q1 to retrieve the sensor signal Vx from the difference signal Vd by synchronous demodulation. The demodulated signal Vox is low-pass filtered by the low-pass filter LP1 to obtain the output signal Voxf which indicates the strength of the sensed magnetic field component in the first direction. The synchronous demodulator DEM2 receives the difference signal Vd and the timing signal Q2 via an inverter or 180 degrees phase shifter PS to retrieve the sensor signal Vy from the difference signal Vd by synchronous demodulation. The demodulated signal Voy is low-pass filtered by the low-pass filter LP2 to obtain the output signal Voyf which indicates the strength of the sensed magnetic field component is the second direction. If the phase shifter PS is omitted, the demodulated signal Voy or the output signal Voyf have to be inverted.

The timing signal Q1 and Q2 must have a phase difference to enable the demodulation of the sensor voltages Vx and Vy from of the difference signals Vd. Preferably, but not essential, the phase difference between the timing signals Q1 and Q2 is 90 degrees. Alternatively, the timing signals Q1 and Q2 may have different frequencies which should not be uneven multiples of each other to enable the synchronous demodulation. The timing signals Q1 and Q2 supplied to the drivers FD 1 and FD2, respectively, should give rise to short pulses for successively alternating the internal magnetization of the sensors Rx, Ry, respectively to obtain the two measurements of the external magnetic field. The timing signals Q1 and Q2-inverted supplied to the demodulators DEM1 and DEM2, respectively, should be synchronized with the level switching of the sensor signals Vx, Vy, respectively caused by the alternating internal magnetization to allow a proper synchronous demodulation.

The use of the differential amplifier AMP1 has the advantage that common mode disturbances in the sensor signals Vx and Vy are largely suppressed. Such common mode disturbances may for example be generated by the apparatus which incorporates the sensors Rx, Ry, such as for example a mobile phone. The common mode disturbances may be caused by external magnetic or electro-magnetic sources. However, due to the differential amplifier AMP1 the two sensor signals Vx, Vy are intermingled. The intermingled signals are separated by using the already present flipping coils to generate phase shifted magnetic fields and to use signals synchronized to the flipping magnetic fields caused by the flipping coils FC1, FC2 for synchronous demodulation of the difference signals Vd.

If the sensors Rx and Ry are single magneto-resistive elements, the total area required by the sensors Rx and Ry and the electronic circuit is much smaller than the prior solution wherein two Wheatstone bridges of sensor elements have to be used. Due to the differential amplifier AMP1 which removes the common mode disturbances, it is less important that the sensitivity of the single sensor element is lower than that of the Wheatstone bridge.

It is not essential to the invention that the same timing signals Q1 and Q2 are supplied to both the drive circuits FD1, FD2 and the demodulators DEM1, DEM2. What counts is that they are correctly linked such that the synchronous demodulation effectively separates the two sensed signals Vx and Vy in the difference signals Vd.

FIGS. 6A to 6I show signals elucidating the operation of the circuit of FIG. 5.

Figure 6:
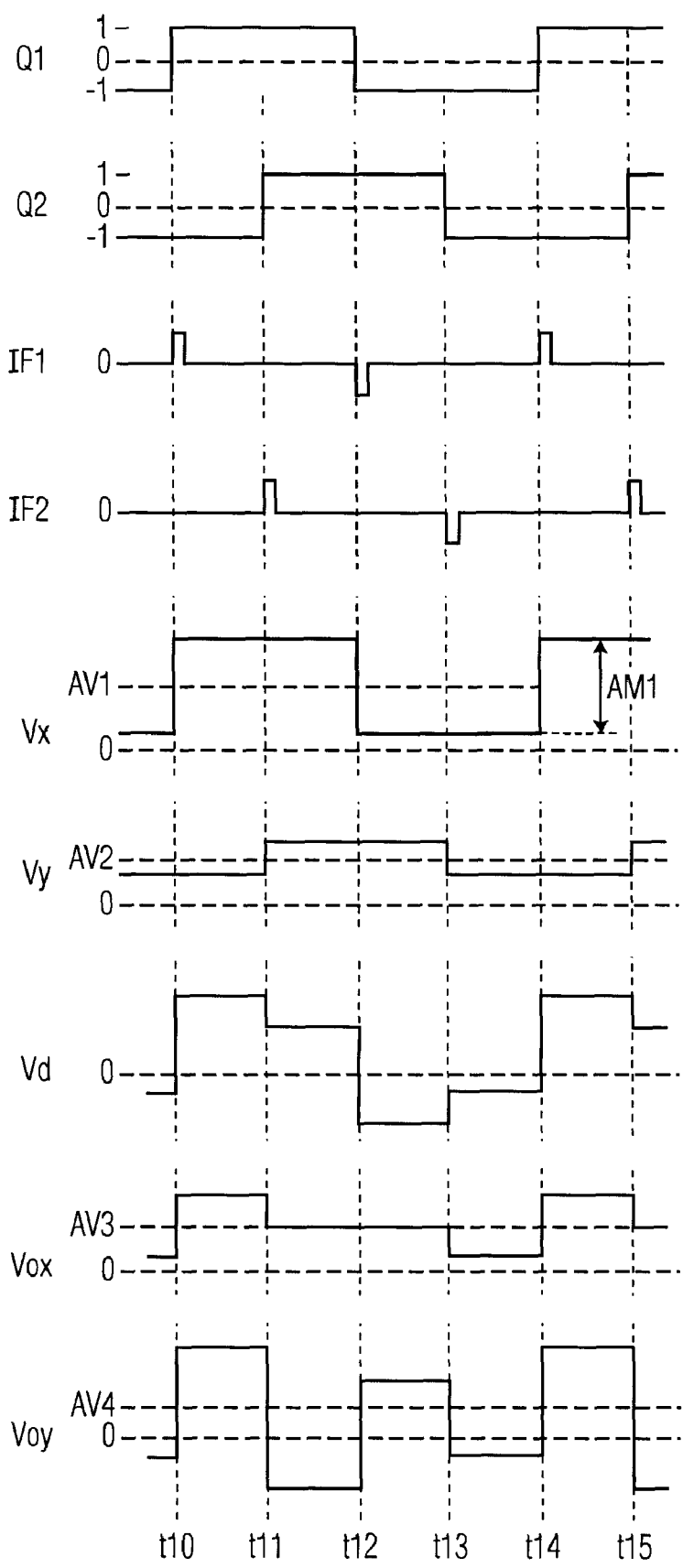
FIGS. 6A to 6I show signals elucidating the operation of the circuit of FIG. 5.

FIG. 6A shows the timing signal Q1 and FIG. 6B shows the timing signal Q2. In the embodiment shown, the timing signals Q1 and Q2 have the same frequency, a phase shift of 90 degrees, and alternatively the normalized levels 1 and −1. The timing signal Q1 changes to the level 1 at the instants t10 and t14, and to the level −1 at the instant t12. The timing signal Q2 changes to the level 1 at the instants t11 and t15, and to the level −1 an the instant t13.

FIG. 6C shows the current IF1 through the flipping coil FC1 which generates a magnetic field sufficiently strong to flip the internal magnetization of the sensor Rx while it has no influence on the magnetization direction of the sensor Ry. FIG. 6D shows the current IF2 through the flipping coil FC2 which generates a magnetic field sufficiently strong to flip the internal magnetization of the sensor Ry while it has no influence on the magnetization direction of the sensor Rx. The flipping currents IF1 and IF2 may comprise relatively short pulses which have a level and duration, for example in the order of microseconds, sufficient to alternate the internal magnetization of the sensor Rx, Ry, respectively. The instant of occurrence of the pulses of the flipping currents IF1 and IF2 is synchronized with the timing signals Q1 and Q2, respectively.

FIG. 6E shows the voltage Vx across the sensor Rx for a particular value of the to be sensed magnetic field component in a first direction. The levels sensed, vary in synchronism with the timing signal Q1 due to the flipping of the internal magnetization of the sensor Rx. As shown in FIG. 2, due to the flipping, the sensed levels occur symmetrically with respect to the offset level which is indicated by RO in FIG. 2 and which is indicated by the average level AV1 in FIG. 6E. It has to be noted that the amplitude AM1 is a measure for the strength of the sensed magnetic field component in the first direction. FIG. 6E shows the voltage Vy across the sensor Ry for a particular value of the to be sensed magnetic field component in the second direction which usually extends perpendicular to the first direction. The levels sensed, vary in synchronism with the timing signal Q2 due to the flipping of the internal magnetization of the sensor Ry. Again, the sensed levels occur symmetrically with respect to the offset level RO which is indicated by the average level AV2 in FIG. 6F. The amplitude AM2 is a measure for the strength of the sensed magnetic field component in the second direction. In the example shown, the offset levels AV1 and AV2 differ, and the amplitude AM1 is three times the amplitude AM2.

FIG. 6G shows the difference signal Vd which is obtained by subtracting the sensor signal Vy from the sensor signal Vx.

FIG. 6H shows the demodulated signal Vox which is obtained by multiplying the sensor signal Vx of FIG. 6E with the timing signal Q1. After low pass filtering in the low-pass filter LP1 the output signal Voxf is obtained which has the average level AV3 which is half the amplitude AM1. FIG. 6I shows the demodulated signal Voy which is obtained by multiplying the sensor signal Vy of FIG. 6F with the inverted timing signal Q2. After low pass filtering in the low-pass filter LP2 the output signal Voxf is obtained which has the average level AV4 which is half the amplitude AM2. The phase shift between the flipping currents IF1 and IF2 and the synchronous demodulation of the sensor signal Vx and Vy with demodulator signals synchronized with the flipping currents IF1 and IF2 allows to recover the strength of the two sensed magnetic field components out of the difference signal Vd. On the other hand, the common mode rejection is greatly improved by adding the differential amplifier AMP1.

It is possible to use the DC-level of the sensor voltages Vx and Vy to bias the input stage of the differential amplifier AMP1.

Figure 7:
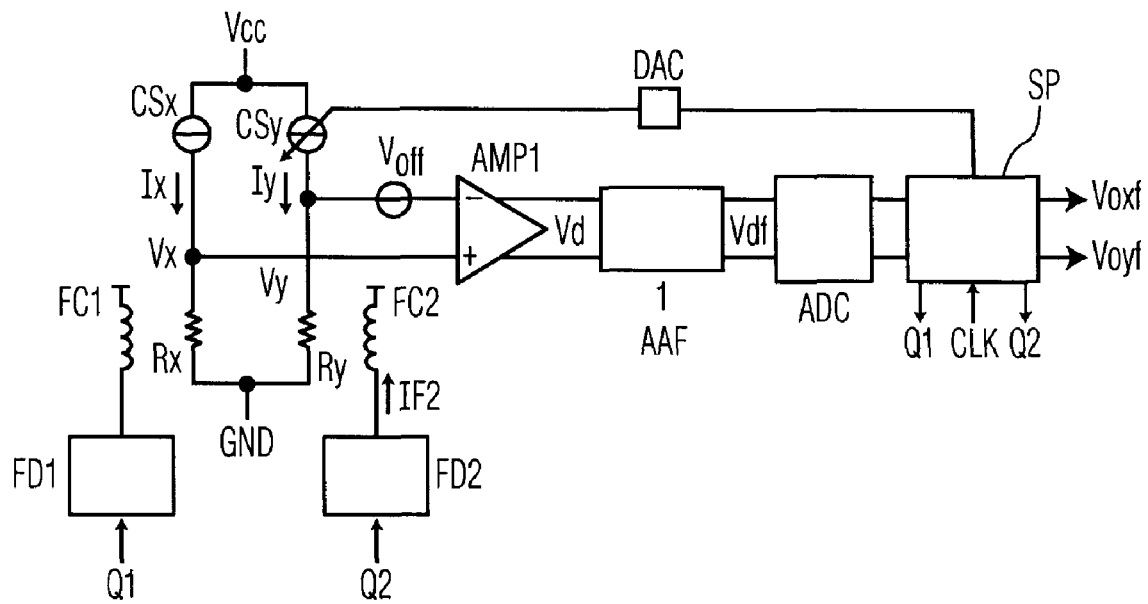
FIG. 7 shows a circuit diagram of another embodiment of the magnetic field sensor circuit.

FIG. 7 shows a circuit diagram of another embodiment of the magnetic field sensor circuit. The current source CSx supplies a predetermined fixed current Ix to the sensor Rx to obtain a sensor voltage Vx across the sensor which depends on the strength of the magnetic field component in the first direction, for example the x direction in a Cartesian x, y system. The current source CSy supplies a controllable current Iy to the sensor Ry to obtain a sensor voltage Vy across the sensor which depends on the strength of the magnetic field component in the second direction, for example the y direction in a Cartesian x, y system. In response to the timing signal Q1, the driver FD1 supplies a current to the flipping coil FC1 associated with the sensor Rx. In response to the timing signal Q2, the driver FD2 supplies a current to the flipping coil FC2 associated with the sensor Ry. Again, the timing signals Q1 and Q2 are used to obtain flipping of the internal magnetizations in the sensors Rx and Ry, wherein a frequency and phase of the timing signal Q1 and Q2 is selected to enable a synchronous demodulation of the difference signal Vd. The difference signal Vd is obtained by substracting the sensor voltage Vy from the sensor voltage Vx in the differential amplifier AMP1.

Instead of the analog circuit shown in FIG. 5, now a digital signal processor SP is used to retrieve the sensed magnetic field components in the x and y direction. The difference signal Vd is filtered in the anti-aliasing filter AAF to obtain a low-pass filtered difference signal Vdf. An analog to digital converter converts the analog low-pass filtered difference signal to a digital difference signal. The digital signal processor SP receives the digital difference signal and a clock signal CLK. The clock signal CLK is used to generate the timing signals Q1 and Q2 which are supplied to the drivers FD1 and FD2. The clock signal CLK is also used to perform the synchronous demodulation and low-pass filtering to obtain the digital output signals Voxf and Voyf which are representative for the external magnetic field components in the x and y direction, respectively.

The digital signal processor SP also performs the offset compensation in the digital domain. The DC-offset is calculated and cancelled by adjusting the current of the current source CSy. A separate digital to analog converter DAC may be used to convert the offset cancellation control signal supplied by the signal processor SP to an analog control signal for the current source CSy. Alternatively, the current source CSy may be a digital to analog converter DAC. The offset cancellation improves the utilization of the dynamic range of the digital to analog converter DAC. The determination of the DC-offset may be performed by flipping the sensors while omitting digital demodulation inside the signal processor SP and calculating the average value of the difference signal Vd.

The bandwidth of interest of the digital low-pass filter in the signal processor SP lies in a range starting from about 500 Hz to 1000 Hz. The lower boundary value has to be selected to be able to detect fast events like a free-fall of the sensor system, the upper frequency limit of this range is selected as low as possible to minimize power consumption and to keep the signal processor SP as simple as possible. It has to be noted that the signal to be sensed is the geomagnetic field, which is a static magnetic field. The user moves the device freely with his hand and, by doing so, modulates the sensed DC magnetic field with frequencies up to several tens of Hertz, for example up to 50 Hz. Thus, for normal usage the bandwidth of interest extends from zero to about 50 Hz. However, if a free fall of the device should be detectable, frequencies higher than 50 Hz should be detectable and a bandwidth from zero to about 500 Hz is required.

The flipping frequency for the timing signals Q1 and Q2 may be selected to be the same as the cut-off frequency of the digital filter. The cut-off frequency of the anti-aliasing filter AAF should be high enough to pass at least the first three harmonics of the difference signal Vd. Usually, a cut-off frequency of the anti-aliasing filter AAF of 5 kHz is sufficient, and the sample rate of the analog to digital converter ADC may be set to 10 kHz.

Figure 8:
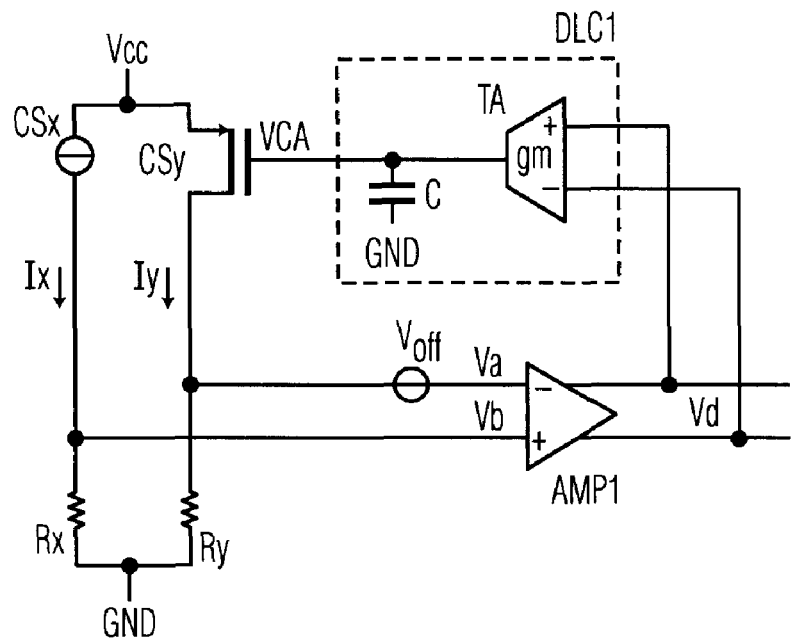
FIG. 8 shows a circuit diagram for elucidating an analog offset compensation.

FIG. 8 shows a circuit diagram for elucidating an analog offset compensation. The current source CSx supplies the current Ix through the sensor Rx, and the current source CSy, which is, for example, a FET, supplies the current Iy through the sensor Ry. Although present, the flipping coils and their drivers are not shown. The differential amplifier AMP1 supplies the differential signal Vd which is the voltage across the sensor Rx minus the voltage across the sensor Ry. Again, the offset voltage in the system is represented by the offset voltage source Voff. A transconductance amplifier TA receives the differential voltage Vd between its inverting and non-inverting inputs. The output of the transconductance amplifier TA is averaged by the capacitor C and supplied to the gate of the FET CSy.

After switching on the power supply voltage Vcc, the FET CSy does not supply current to the sensor Ry. Consequently, the voltage over Ry is zero volts while the voltage across the sensor Rx is equal to Ix*Rx. The current supplied by the amplifier TA causes the voltage across the capacitor C to increase. The resultant voltage across the capacitor C increases until the FET CSy supplies a current Iy to the sensor Ry such that the voltage Iy*Ry gets a value to obtain equal voltages at the inverting and non-inverting inputs of the differential amplifier AMP1. Consequently, until the offset voltage Voff is compensated. The bandwidth of the feedback loop comprising the amplifier TA and the capacitor C is selected such that the signals with the flipping frequencies do not influence the offset compensation.

Figure 9:
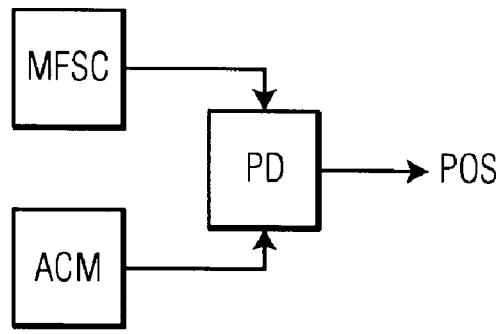
FIG. 9 shows a block diagram of an electronic compass.

FIG. 9 shows a block diagram of an electronic compass. The electronic compass comprises the magnetic field sensor circuit MFSC in accordance with the present invention, for example as shown in FIGS. 5 or 7. The magnetic field sensor circuit MFSC may be constructed to sense a two-dimensional part of, or the complete three dimensional earth magnetic field. The accelerometer ACM supplies a signal indicating a direction of the earth gravity field. The orientation determining circuit PD receives the output signals of the magnetic field sensor circuit MFSC and the accelerometer ACM to determine an orientation of the electronic compass with respect to the earth, as for example disclosed in (not yet published?) European patent application (ID691963).

Figure 10:
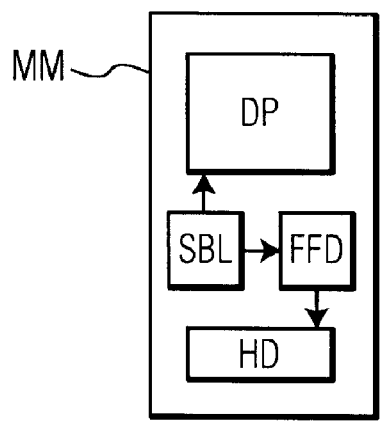
FIG. 10 shows a block diagram of a hand-held apparatus with a magnetic field sensor circuit.

FIG. 10 shows a block diagram of a hand-held apparatus with a magnetic field sensor circuit. The hand-held apparatus MM comprises a sensor block SBL which comprises the magnetic field sensor circuit MFSC and an accelerometer. The hand-held apparatus MM further comprises a free-fall detector FFD, and a display DP. The free fall detector FFD is coupled to the sensor block SBL for detecting from the variations of the sensed magnetic field and the sensed gravity field whether the hand-held apparatus is falling and if so for switching off the hand-held apparatus (not shown). The sensed magnetic field and/or gravity field may also be processed to data DS to be displayed on the display DP. The hand-held apparatus is, for example, a mobile phone, a PDA, a navigation device, a game console.

If the hand-held apparatus MM comprises a hard-disk HD, the free fall detector FFD may further be used for parking a head of the hard disk HD in a safe parking zone when is detected that the apparatus is falling.

Figure 11:
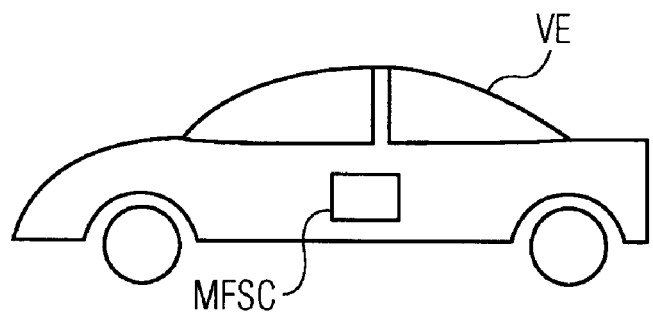
FIG. 11 shows a vehicle comprising the magnetic field sensor circuit.

FIG. 11 shows a vehicle comprising the magnetic field sensor circuit MFSC. In a vehicle, the magnetic field sensor circuit may, for example, be used for determining the geomagnetic north for navigation purposes.

It should be noted that the above-mentioned embodiments illustrate rather than limit the invention, and that those skilled in the art will be able to design many alternative embodiments without departing from the scope of the appended claims. For example, although all embodiments use two sensors for sensing two-dimensional magnetic fields, it is also possible to add a further sensor if three-dimensional magnetic fields are to be sensed. The currents in the three flipping coils should have different phases and/or frequencies such that it is possible to retrieve the individual sensor signals from the difference signal.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A magnetic field sensor circuit comprising:
   a first magneto-resistive sensor for sensing a first magnetic field component in a first direction to supply a first sense signal,
   a first flipping coil for applying a first flipping magnetic field with a periodically changing polarity to the first magneto-resistive sensor for causing the first sense signal to have alternating different levels synchronized with the first flipping magnetic field,
   a second magneto-resistive sensor for sensing a second magnetic field component in a second direction different than the first direction to supply a second sense signal,
   a second flipping coil for applying a second flipping magnetic field with a periodically changing polarity to the second magneto-resistive sensor for causing the second sense signal to have an alternating different levels synchronized with the second flipping magnetic field, a phase of the first flipping magnetic field and the second flipping magnetic field being different,
   a differential amplifier configured to receive the first sense signal and the second sense signal to obtain a difference signal,
   a first synchronous demodulator configured to receive the difference signal and a first switching signal being phase locked to the alternating different levels of the first sense signal to supply a first output signal indicating the first magnetic field component, and
   a second synchronous demodulator configured to receive the difference signal and a second switching signal being phase locked to the alternating different levels of the second sense signal to supply a second output signal indicating the second magnetic field component.

2. A magnetic field sensor circuit as claimed in claim 1, wherein the first magneto-resistive sensor is a first magneto-resistive element, and wherein the second magneto-resistive sensor is a second magneto-resistive element, the magnetic field sensor circuit further comprises:
   a first current source for supplying a first current to the first magneto-resistive element to obtain the first sense signal, and
   a second current source for supplying a second current to the second magneto-resistive element to obtain the second sense signal.

3. A magnetic field sensor circuit as claimed in claim 2, wherein the first synchronous demodulator is operable to be temporarily kept on hold for obtaining the first output signal being a measure for an offset, wherein the circuit further comprises and a DC-level controller for receiving the first output signal for controlling a DC level of the second current source to compensate for the offset.

4. magnetic field sensor circuit as claimed in claim 3, further comprising an analog to digital converter for converting the difference signal into a digital difference signal, and wherein the DC-level controller comprises a digital to analog converter for controlling the second current source in response to a value of the first output signal.

5. A magnetic field sensor circuit as claimed in claim 1, further comprising a first driver for supplying a current having a first sequence of pulses with alternating polarity to the first flipping coil and a second driver for supplying a current having a second sequence of pulses with alternating polarity to the second flipping coil, and wherein the pulses of the first sequence and the second sequence have a non-zero phase shift.

6. A magnetic field sensor circuit as claimed in claim 1, further comprising a first low-pass filter or a first integrator for low-pass filtering the first output signal, and a second low-pass filter or second integrator for low-pass filtering the second output signal.

7. A magnetic field sensor circuit as claimed in claim 6, wherein the first low pass filter and the second low-pass filter have a bandwidth in a range from 500 to 1000 Hz.

8. An electronic compass comprising the magnetic field sensor circuit of claim 1 and an orientation determining circuit coupled to the magnetic field sensor circuit for determining the orientation with respect to the earth.

9. A hand-held apparatus comprising the electronic compass of claim 8.

10. A hand-held apparatus as claimed in claim 9, further comprising a hard disk and a free fall detector coupled to the magnetic field sensor circuit and the accelerometer for detecting whether the hand-held apparatus is falling and if so: for parking a head of the hard disk in a parking zone.

11. A vehicle comprising the magnetic field sensor circuit (MFSC) of claim 1.

* * * * *